(12) United States Patent
Digari et al.

(10) Patent No.: US 6,864,714 B2
(45) Date of Patent: Mar. 8, 2005

(54) PLDS PROVIDING REDUCED DELAYS IN CASCADE CHAIN CIRCUITS

(75) Inventors: Kailash Digari, Uttrakhand (IN); Nitin Deshmukh, Delhi (IN)

(73) Assignee: STmicroelectronics Pvt. Ltd., Uttar Pradesh (IN)

(*) Notice: Subject to any disclaimer, the term of this patent is extended or adjusted under 35 U.S.C. 154(b) by 68 days.

(21) Appl. No.: 10/460,040

(22) Filed: Jun. 10, 2003

(65) Prior Publication Data

US 2003/0234667 A1 Dec. 25, 2003

(30) Foreign Application Priority Data

Jun. 10, 2002 (IN) ..................................... 624/DEL/2002

(51) Int. Cl.$^7$ .......................................... H03K 19/177
(52) U.S. Cl. .......................................... 326/41; 326/38
(58) Field of Search ........................ 326/37–41, 46–47

(56) References Cited

U.S. PATENT DOCUMENTS 5,258,668 A 11/1993 Cliff et al.
6,359,469 B1 * 3/2002 Mendel et al. ................ 326/40

* cited by examiner

Primary Examiner—Anh Q. Tran
(74) Attorney, Agent, or Firm—Graybeal Jackson Haley LLP (57) ABSTRACT

The present invention provides a Programmable Logic Device (PLD) incorporating a two-input multiplexer for providing a Cascade Logic output and having a Cascade Logic input coupled to a select line. A two-input multiplexer provides the desired configurable Cascade Logic function, and an initialization circuit sets the initial value for the Cascade logic under control of an initialization configuration bit. The multiplexer that provides the Cascade Logic output also provides the desired configurable Cascade Logic function using the Look-up table (LUT) and configuration bits.

28 Claims, 7 Drawing Sheets

Figure: 1

(Background Art)

Figure 2

(Background Art)

Figure 3

(Background Art)

PLDS PROVIDING REDUCED DELAYS IN CASCADE CHAIN CIRCUITS

PRIORITY CLAIM

This application claims priority from Indian patent application No. 624/Del/2002, filed 10 Jun. 2002, which is incorporated herein by reference.

BACKGROUND

1. Technical Field

This invention relates to Programmable Logic Devices providing reduced delays in cascade chain circuits.

2. Description of the Prior Art

Programmable Logic Devices (PLD) are general purpose logic devices that are configured to provide the functionality required for a particular application. The PLD is internally structured as multiple Configurable Logic Blocks (CLBs), each block containing a Look-Up Table (LUT) that provides a configurable logic function. The CLBs may be interconnected through programmable connection matrices that are provided between them. Multiple CLBs are interconnected to implement the desired logic functions. PLDs are often used in applications that require evaluation of functions involving a large number of inputs being processed in parallel. This requirement leads to the need for cascading of several CLBs to provide the desired number of inputs and/or outputs. The intermediate outputs from each CLB are connected serially using gates to get the desired output. Use of the LUT to perform the desired logic function generally involves considerable propagation delay. Such delay is generally unacceptable for simple logic functions. To overcome the problem of delay most PLDs incorporate special "Cascade Logic" that facilitates the formation of a chain of logic providing minimal delays using special circuitry generally in the form of multiplexers or particular logic gates.

FIG. 1 shows a generic Cascade Logic architecture. A two-input AND gate is included at the output of the LUT in each CLB. One input of each two-input AND gate receives the output from the corresponding LUT while the second input forms the Cascade Logic input that is connected to the Cascade Logic Output from the previous CLB stage. This implementation is very inefficient for implementing Cascade Logic functions that are not simple AND gates. The delay in generating the final output is equal to the sum of the propagation delays of all the AND gates in the Cascade chain + the delay of the first LUT in the chain.

Figure 2:
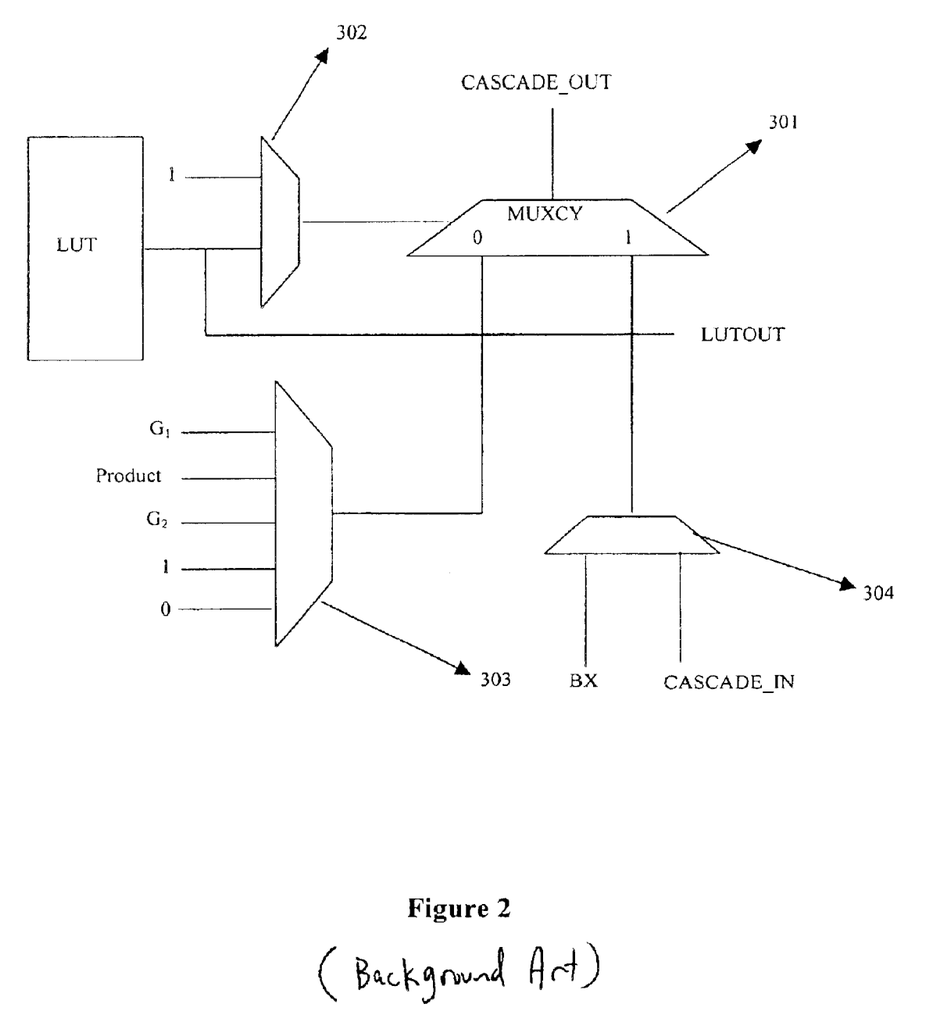
FIG. 2 shows a prior art cascade logic architecture according to Vertex II by Xilinx.

FIG. 2 shows the Cascade Chain implementation in Virtex II (reference: Data Sheet DS031-2(v1.5) Apr. 2, 2001) by Xilinx. MUXCY 201 is used to implement AND, NAND, NOR, OR gate cascade chains. MUX 304 is used to select between signal BX and CASCADE_IN (which is also carry_in in Virtex II) for providing the input to the chain from the outside. Mux 303 is used to initialize the other input to MUXCY as either "0" or "1". LUTOUT is selected using Mux 302. MUXCY works as an AND, OR, NAND, NOR gate depending on the polarity of the inputs. This implementation does not have delay on the LUT output but the additional outputs for the LUT and for CASCADE_OUT increase the number of routing resources needed. This cascade logic is capable of implementing several logic functions including AND, OR, NOR, and NAND.

Figure 3:
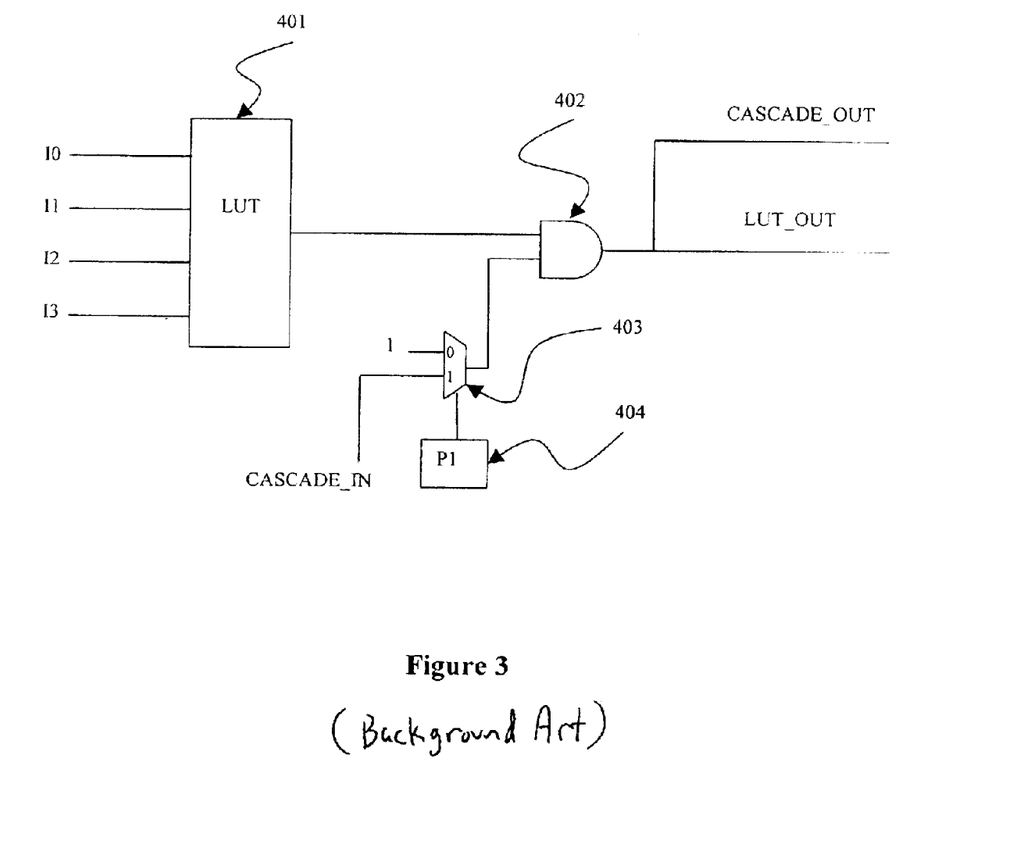
FIG. 3 shows another prior art cascade logic architecture.

FIG. 3 shows another example of cascade chain implementation in field programming gate arrays (FPGAs) used by Altera Inc., Ref APEX 20K Programmable Logic Device Family Data Sheet Ver. 3.7 May 2001. The output of LUT 401 and cascade input signal are logically ANDed by AND gate 402. The output of gate 402 is the LUT output. The Cascade chain output (if chain is terminated) as well as the cascade input for the next stage depend on the value of configuration bit P1. When the cascade chain is not used, configuration bit P1 is set to "0" and the output of multiplexer 403 is "1" enabling AND gate 402 which passes the output of LUT 401 to LUT_OUT. When P1 is set to "1" the output of LUT 401 and cascade input CASCADE_IN are logically ANDed. The output of gate 402 is the final cascade chain output for the last stage of the chain and is the cascade input for next stage for the first and the intermediate stages. The same circuit can be used for other gate functions by applying Demorgan's Laws, inverting inputs to LUT where necessary and absorbing the final inverters in other LUT's or IO blocks where possible. This implementation reduces the number of outputs but introduces delay in LUT output path. The cascade circuitry is not very versatile and is difficult to use for implementing other two-input functions.

SUMMARY

One aspect of the present invention is to facilitate the implementation of Cascade Logic functions with minimal delay from any input to output.

Another aspect of the invention is to provide the implementation of Cascade Logic functions requiring minimum area for implementation.

According to one aspect of the present invention, a Programmable Logic Device (PLD) incorporates a two-input multiplexer that provides the Cascade Logic output and which has the Cascade Logic input coupled to its select line. A two-input multiplexer providing the desired configurable Cascade Logic function, and an initialization circuit sets the initial value for the Cascade logic under control of an initialization configuration bit. The multiplexer providing the Cascade Logic output also provides the desired configurable Cascade Logic function using the LUT and configuration bits. The initialization circuit is another two-input multiplexer connected to one input or the select line of the output multiplexer, and providing selectable initialization based on the value of a configuration bit when initialization mode is enabled by another configuration bit. The LUT and a configuration bit provide any desired cascade logic function using the output two-input multiplexer.

BRIEF DESCRIPTION OF THE DRAWINGS

FIG. 1 shows a functional block diagram of a typical cascade logic architecture.

FIG. 5 shows the embodiment of FIG. 4 incorporating initialization circuitry.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 4:
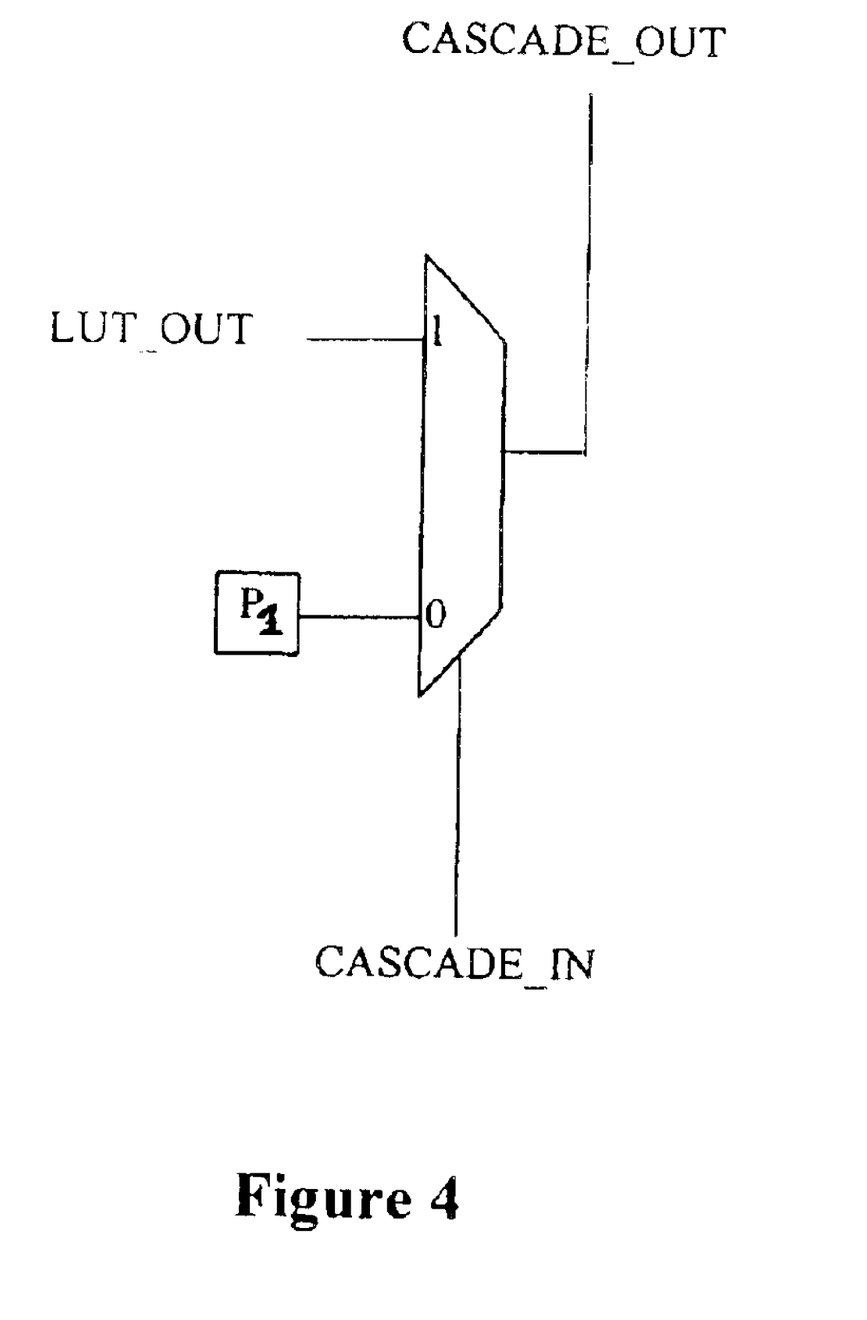
FIG. 4 shows a first embodiment of Cascade logic according to the present invention.

The implementation of FIG. 4 makes it possible for CASCADE_IN and LUT_OUT to be ANDed, ORed, NORed, NANDed together to give CASCADE_OUT depending on the programming bit $P_1$. The input-output delay is the minimum possible as it corresponds only to the delay from the select input to the output of the two-input MUX. This arrangement also minimizes the loading on the CASCADE_IN line as the multiplexer select input offers the minimum Capacitive loading. The minimal Capacitive loading further reduces the delay of the Cascade Logic stage as well as the power dissipation of the circuit. However this basic circuit requires some means of initialization. For initialization of the Cascade Logic CASCADE_OUT is required to be independent of CASCADE_IN. To achieve this it is necessary to initialize CASCADE_OUT to "0" or "1", after which the cascade chain can commence from the next LUT. To achieve this it is necessary to replicate either "0" or "1" on both the inputs of CACSCADE Mux at the time of initialization.

FIG. 5 shows an circuit that provides initialization for the basic circuit of FIG. 4. In this embodiment, CASCADE_IN is routed through an additional multiplexer having its select input controlled by an additional configuration bit $P_2$. Setting $P_2$ to "1" allows CASCADE_OUT to be initialized to the desired value using configuration bit $P_1$. CASCADE_OUT and LUT_OUT are a single output. However this arrangement loses some of the minimum delay advantage of the basic circuit as the initialization Mux adds an input-output propagation delay for the CASCADE_IN signal.

Figure 6:
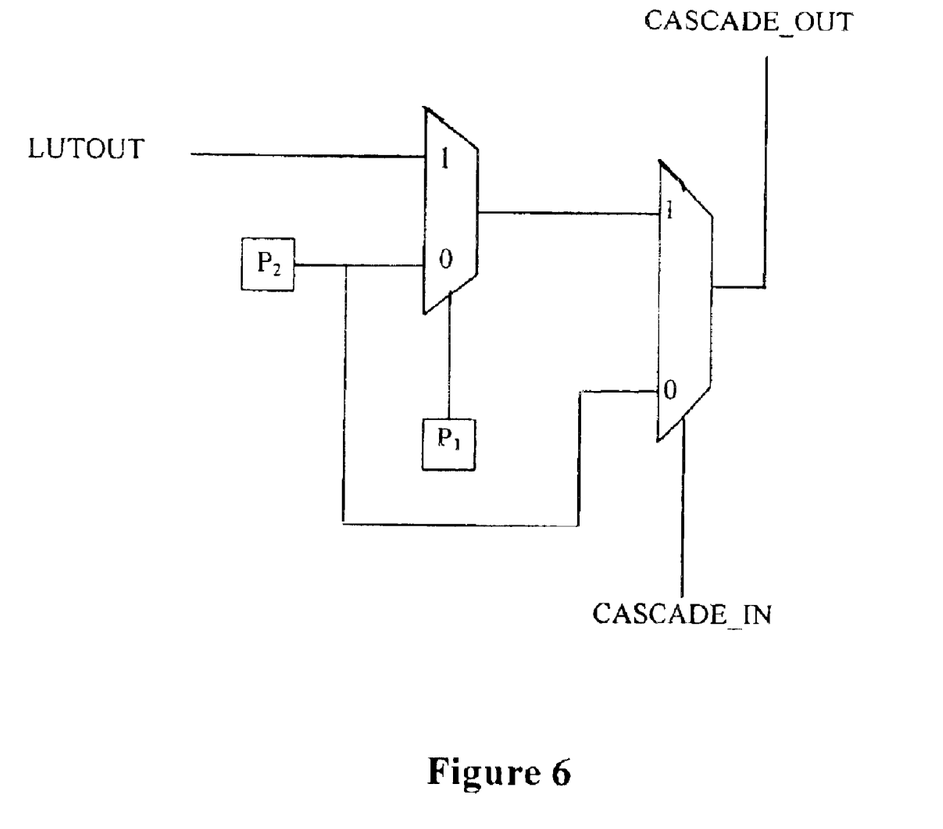
FIG. 6 shows another embodiment of the present invention for cascading of circuits.

FIG. 6 shows an alternative circuit arrangement that provides initialization while retaining the minimal select-output delay of a Mux. The CASCADE_IN input is routed through an additional two-input multiplexer that selects either configuration bit $P_2$ or CASCADE_IN depending on the value of configuration bit $P_1$. Configuration bit $P_1$ selects Cascade Logic operation when it is set to "1". Setting $P_1$ to "0" enables initialization based on the value of configuration bit $P_2$. When $P_1$ is "0" Cascade Logic operation is enabled while when $P_1$ is "1" normal LUT operation is enabled. In this arrangement setting $P_1$ to "0" replicates $P_2$ on both the inputs of the Cascade logic Mux thus initializing CASCADE_OUT to either "0" or "1". Configuration bit $P_2$ also operates in conjunction with LUTOUT to provide various possible logic functions. This arrangement, however, requires separate output lines for normal and Cascade Logic operations, and hence requires a higher I/O count.

Figure 7:
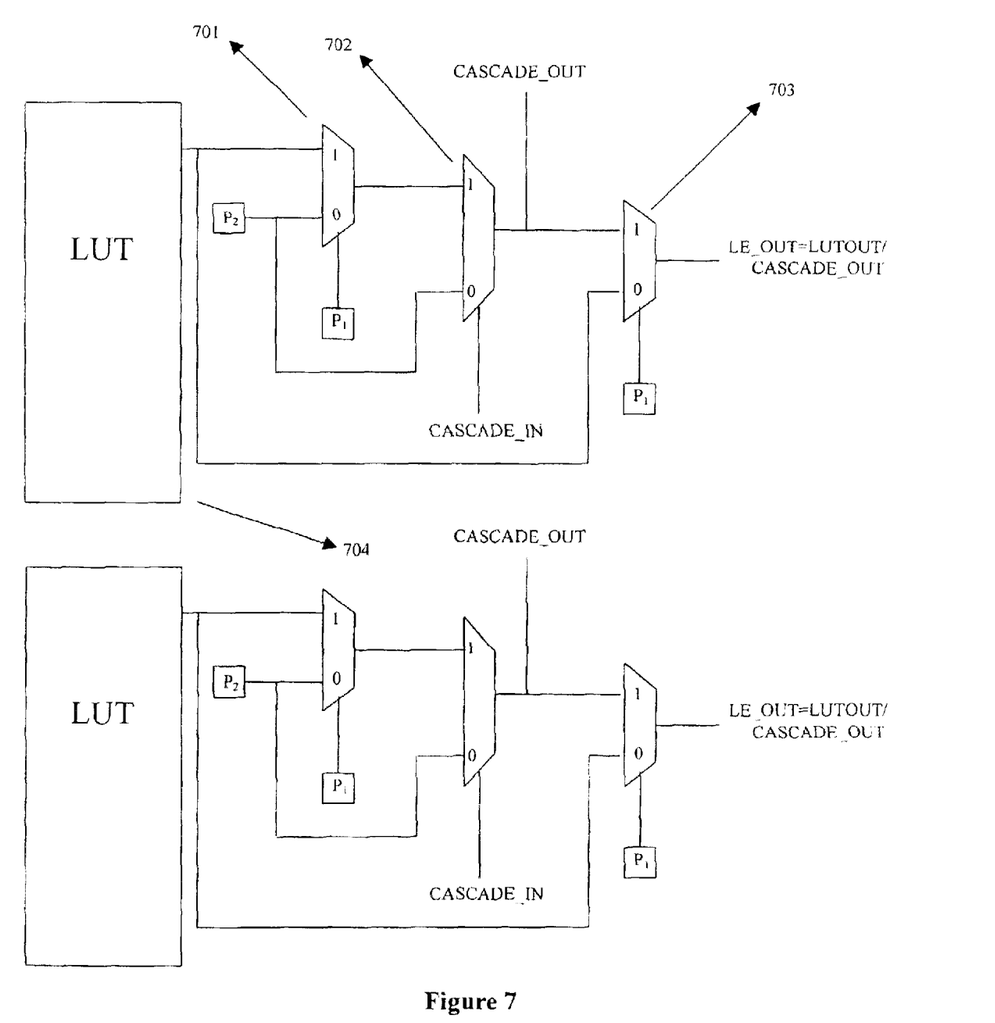
FIG. 7 shows a modification of the embodiment of FIG. 6 including an arrangement for sharing the output between the cascade logic and normal LUT function.

FIG. 7 shows an arrangement for reducing the I/O count while retaining the advantage of minimal delay with built-in initialization circuitry. The arrangement uses two muxes (701 and 702) for cascade chain implementation. A third Mux 703 is added for tapping either LUTOUT or CAS-CADEOUT as the final output. CASCADEOUT can be initialized as "1" or "0" for the cascade chain starting from the next LUT. When the programmable bit $P_1$ is set to "0", then the Cascade circuitry is in initializing mode depending on $P_2$. When $P_1$ is set to "1" then cascade circuitry is in cascade mode and LUTOUT is selected as the input to mux 702. The normal working mode of LUT requires $P_1$ to be "0". In this mode, the circuit can either initialize the cascade chain starting from next LE_OUT or keep the cascade circuitry in non-switching mode. If $P_2$ is set to "0", then the cascade circuitry works like an effective AND chain with initial cascade input equal to "0". Thus, the cascade circuitry does not unnecessarily switch and power is not wasted.

The delay from CASCADE_IN to CASCADE_OUT is the minimal possible, as the CASCADE_IN signal is the select pin of the multiplexer where the load is less than the driving pin of the multiplexer. This implementation does not require buffers to improve signal integrity as the CASCADE_OUT output is driven by lightly loaded signals. Thus, the circuitry is performance efficient. The circuitry is flexible enough to implement many two-input functions besides AND, OR, NOR, NAND gates. The minimal number of components makes the circuitry area efficient. The detailed functionality is shown in two tables below:

TRUTH TABLE

| $P_1$ | $P_2$ | LUTOUT | CASCADE_IN | CASCADE_OUT | LE_OUT |
|---|---|---|---|---|---|
| 0 | 0 | 0 | 0 | 0 | 0 |
| 0 | 0 | 0 | 1 | 0 | 0 |
| 0 | 0 | 1 | 0 | 0 | 1 |
| 0 | 0 | 1 | 1 | 0 | 1 |
| 0 | 1 | 0 | 0 | 1 | 0 |
| 0 | 1 | 0 | 1 | 1 | 0 |
| 0 | 1 | 1 | 0 | 1 | 1 |
| 0 | 1 | 1 | 1 | 1 | 1 |
| 1 | 0 | 0 | 0 | 0 | 0 |
| 1 | 0 | 0 | 1 | 0 | 0 |
| 1 | 0 | 1 | 0 | 0 | 0 |
| 1 | 0 | 1 | 1 | 1 | 1 |
| 1 | 1 | 0 | 0 | 1 | 1 |
| 1 | 1 | 0 | 1 | 0 | 0 |
| 1 | 1 | 1 | 0 | 1 | 1 |
| 1 | 1 | 1 | 1 | 1 | 1 |

FUNCTIONALITY

| $P_1$ | $P_2$ | LUTOUT | CASCADE_IN | CASCADE_OUT Functionality | LEOUT Functionality |
|---|---|---|---|---|---|
| 0 | 0 | Normal | Normal | Initialized to 0 | LUTOUT |
| 0 | 0 | Normal | Inverted | Initialized to 0 | |
| 0 | 0 | Inverted | Normal | Initialized to 0 | |
| 0 | 0 | Inverted | Inverted | Initialized to 0 | |
| 0 | 1 | Normal | Normal | Initialized to 1 | |
| 0 | 1 | Normal | Inverted | Initialized to 1 | |
| 0 | 1 | Inverted | Normal | Initialized to 1 | |
| 0 | 1 | Inverted | Inverted | Initialized to 1 | |
| 1 | 0 | Normal | Normal | AND | CASCADE_OUT |
| 1 | 0 | Normal | Inverted | LUTOUT & ~CASCADE_IN | |
| 1 | 0 | Inverted | Normal | ~LUTOUT & CASCADE_IN | |
| 1 | 0 | Inverted | Inverted | NOR | |
| 1 | 1 | Normal | Normal | LUTOUT \| ~CASCADE_IN | |
| 1 | 1 | Normal | Inverted | OR | |
| 1 | 1 | Inverted | Normal | NAND | |
| 1 | 1 | Inverted | Inverted | ~LUTOUT \| CASCADE_IN | |

The embodiments of the invention shown in FIGS. 4–7 may be implemented in an integrated circuit that is part of a large electronic system. For example, a memory may include cascade chain circuitry as shown in FIGS. 4–7, and such a memory may be coupled to a processor to form a computer system or portion thereof.

It will be apparent to those with ordinary skill in the art that the foregoing is merely illustrative and is not intended to be exhaustive or limiting. The embodiments shown and described have been presented by way of example only, and various modifications, equivalents, and combinations are within the scope of the present invention. Accordingly, this invention is not to be considered limited to the specific examples chosen for purposes of disclosure. The invention is therefore not limited by the description contained herein or by the drawings, but only by the claims.

What is claimed is:

1. An integrated circuit configurable for providing minimal delay and minimal circuit area for cascade logic functions in addition to normal look-up table based configurable logic functions, the integrated circuit comprising:
   a plurality of configurable logic blocks, each logic block including,
   a two-input multiplexer providing a cascade logic output and having a cascade logic input coupled to a select input;
   a two-input multiplexer providing a desired configurable cascade logic function; and
   an initialization circuit coupled to the two-input multiplexers that sets the initial value for the cascade logic under control of an initialization configuration bit.

2. The integrated circuit of claim 1 wherein the multiplexer providing the cascade logic output also provides the desired configurable cascade logic function responsive to a configurable logic signal and at least one configuration bit.

3. The integrated circuit of claim 1 wherein the initialization circuit is another two-input multiplexer connected to one input or the select line of the output multiplexer, and providing selectable initialization based on the value of a configuration bit when initialization mode is enabled by another configuration bit.

4. The integrated circuit of claim 1 wherein a configurable logic signal and a configuration bit provide any desired cascade logic function using the two-input multiplexer providing the cascade logic output.

5. The integrated circuit of claim 4 wherein the logic functions include AND, OR, NOR and NAND logic functions.

6. The integrated circuit of claim 1 wherein the integrated circuit comprises a programmable gate array.

7. The integrated circuit of claim 1 wherein the integrated circuit comprises a programmable logic device.

8. A configurable output circuit comprising a multiplexer having a first input adapted to receive a configurable logic output signal, a second input adapted to receive a programmable logic signal, and a selection input adapted to receive a cascade logic signal, the configurable output circuit operable to initialize an output signal of the multiplexer to a desired logic stage and the multiplexer thereafter performing a desired logical operation of the configurable logic output signal and the cascade logic signal and developing the output signal indicating the result of the performed logical operation, and the output signal having a value that is a function of the value of the programmable logic signal.

9. The configurable output circuit of claim 8 wherein the programmable logic signal comprises a programming bit applied to one input of the multiplexer.

10. The configurable output circuit of claim 8 further comprising a second multiplexer coupled to selection input and having a first input adapted to receive the cascade logic signal, a second input adapted to receive the programmable logic signal, and a selection input adapted to receive a second programmable logic signal.

11. The configurable output circuit of claim 8 further comprising a second multiplexer coupled to the first input of the multiplexer and having a first input adapted to receive the configurable logic output signal, a second input coupled to the second input of the multiplexer to receive the programmable logic signal, and a selection input adapted to receive a second programmable logic signal.

12. The configurable output circuit of claim 11 further comprising a third multiplexer having a first input adapted to receive the configurable logic output signal, a second input coupled to the output of the multiplexer to receive the output signal, and a selection input adapted to receive the second programmable logic signal.

13. A memory device including a configurable circuit for providing minimal delay and minimal circuit area for cascade logic functions in addition to normal look-up table based configurable logic functions, the configurable circuit comprising:
   a plurality of configurable logic blocks, each logic block including,
   a two-input multiplexer providing a cascade logic output and having a cascade logic input coupled to a select input;
   a two-input multiplexer providing a desired configurable cascade logic function; and
   an initialization circuit coupled to the two-input multiplexers that sets the initial value for the cascade logic under control of an initialization configuration bit.

14. The integrated circuit of claim 13 wherein the multiplexer providing the cascade logic output also provides the desired configurable cascade logic function responsive to a configurable logic signal and at least one configuration bit.

15. The integrated circuit of claim 13 wherein the initialization circuit is another two-input multiplexer connected to one input or the select line of the output multiplexer, and providing selectable initialization based on the value of a configuration bit when initialization mode is enabled by another configuration bit.

16. The integrated circuit of claim 13 wherein a configurable logic signal and a configuration bit provide any desired cascade logic function using the two-input multiplexer providing the cascade logic output.

17. The integrated circuit of claim 16 wherein the logic functions include AND, OR, NOR and NAND logic functions.

18. The integrated circuit of claim 13 wherein the integrated circuit comprises a programmable gate array.

19. The integrated circuit of claim 13 wherein the integrated circuit comprises a programmable logic device.

20. A computer system including a memory device, the memory device including a configurable circuit for providing minimal delay and minimal circuit area for cascade logic functions in addition to normal look-up table based configurable logic functions, the configurable circuit comprising:
   a plurality of configurable logic blocks, each logic block including,
   a two-input multiplexer providing a cascade logic output and having a cascade logic input coupled to a select input;
   a two-input multiplexer providing a desired configurable cascade logic function; and
   an initialization circuit coupled to the two-input multiplexers that sets the initial value for the cascade logic under control of an initialization configuration bit.

21. The integrated circuit of claim 20 wherein the multiplexer providing the cascade logic output also provides the desired configurable cascade logic function responsive to a configurable logic signal and at least one configuration bit.

22. The integrated circuit of claim 20 wherein the initialization circuit is another two-input multiplexer connected to one input or the select line of the output multiplexer, and providing selectable initialization based on the value of a configuration bit when initialization mode is enabled by another configuration bit.

23. The integrated circuit of claim 20 wherein a configurable logic signal and a configuration bit provide any desired cascade logic function using the two-input multiplexer providing the cascade logic output.

24. The integrated circuit of claim 23 wherein the logic functions include AND, OR, NOR and NAND logic functions.

25. The integrated circuit of claim 20 wherein the integrated circuit comprises a programmable gate array.

26. The integrated circuit of claim 20 wherein the integrated circuit comprises a programmable logic device.

27. A method for providing minimal delay and minimal circuit area for cascade logic functions in a programmable logic device, comprising:

configuring a desired cascade logic function using a two-input multiplexer receiving a configurable logic output signal and a configuration bit;

receiving a cascade logic signal at a select input of the multiplexer to provide minimal loading and delay for the cascade logic function; and initializing the cascade logic function using an initialization configuration bit that sets an output of the multiplexer to a desired value.

28. The method of claim 27 wherein the desired cascade logic function comprises one of a logical AND, NAND, OR, and NOR function.

* * * * *